United States Patent [19]

Conner et al.

[11] Patent Number: 4,694,566
[45] Date of Patent: Sep. 22, 1987

[54] METHOD FOR MANUFACTURING PROGRAMMABLE READ-ONLY MEMORY CONTAINING CELLS FORMED WITH OPPOSING DIODES

[75] Inventors: George W. Conner, Ben Lomond; Raymond G. Donald, San Jose; Ronald L. Cline, Los Gatos, all of Calif.

[73] Assignee: Signetics Corporation, Sunnyvale, Calif.

[21] Appl. No.: 757,185

[22] Filed: Jul. 19, 1985

Related U.S. Application Data

[63] Continuation of Ser. No. 367,492, Apr. 12, 1982, abandoned.

[51] Int. Cl.$^4$ .................. H01L 21/265; H01L 29/72; H01L 21/225
[52] U.S. Cl. .......................................... 437/48; 437/61
[58] Field of Search ............... 29/576 W, 571, 576 B, 29/578, 577 C, 580; 148/1.5; 357/49, 50, 45, 90; 365/105

[56] References Cited

U.S. PATENT DOCUMENTS

| | | | |
|---|---|---|---|
| 3,648,125 | 3/1972 | Peltzer | 148/187 X |
| 3,756,861 | 9/1973 | Payne et al. | 148/1.5 |
| 3,992,232 | 11/1976 | Kaji et al. | 357/50 X |
| 4,066,473 | 1/1978 | O'Brien | 148/1.5 |
| 4,099,260 | 7/1978 | Lynes et al. | 365/105 |
| 4,111,720 | 9/1978 | Michel et al. | 148/1.5 |
| 4,229,757 | 10/1980 | Moussie | 365/105 X |
| 4,266,985 | 5/1981 | Ito et al. | 148/1.5 |
| 4,268,950 | 5/1981 | Chatterjee et al. | 29/571 |
| 4,418,468 | 12/1983 | Vora et al. | 29/577 C |
| 4,624,046 | 11/1986 | Shideler et al. | 29/576 B |

FOREIGN PATENT DOCUMENTS

| | | |
|---|---|---|
| 0018173 | 10/1980 | European Pat. Off. |
| 7632739 | 5/1978 | France |
| 2005079 | 4/1979 | United Kingdom |

OTHER PUBLICATIONS

"16-K PROM Uses Vertical Fuses", in *Electronics*, Feb. 24, 1982, p. 184.
"Vertical-Fuse Scheme Boosts Reliability in Bipolar PROMs", in *Electronics*, Feb. 10, 1982, p. 33.
M. Grossman, "Recessed-Oxide Isolation Hikes IBM's LSI Density and Speed", *Electronic Design*, 7 Jun. 1979, pp. 26-28.

*Primary Examiner*—Olik Chaudhuri
*Attorney, Agent, or Firm*—R. J. Meetin; R. T. Mayer; J. Oisher

[57] ABSTRACT

A semiconductor PROM containing a group of PROM cells (12) each consisting of a pair of opposing diodes oriented vertically with their common intermediate region (22) fully adjoining a recessed oxide insulating region (16) is fabricated by a process in which the insulating region serves as a mask to control the lateral extents of the dopants utilized to define the diodes. The intermediate cell regions are ion implanted to obtain maximum dopant concentration near their mid-points. This facilitates programming operation.

14 Claims, 18 Drawing Figures

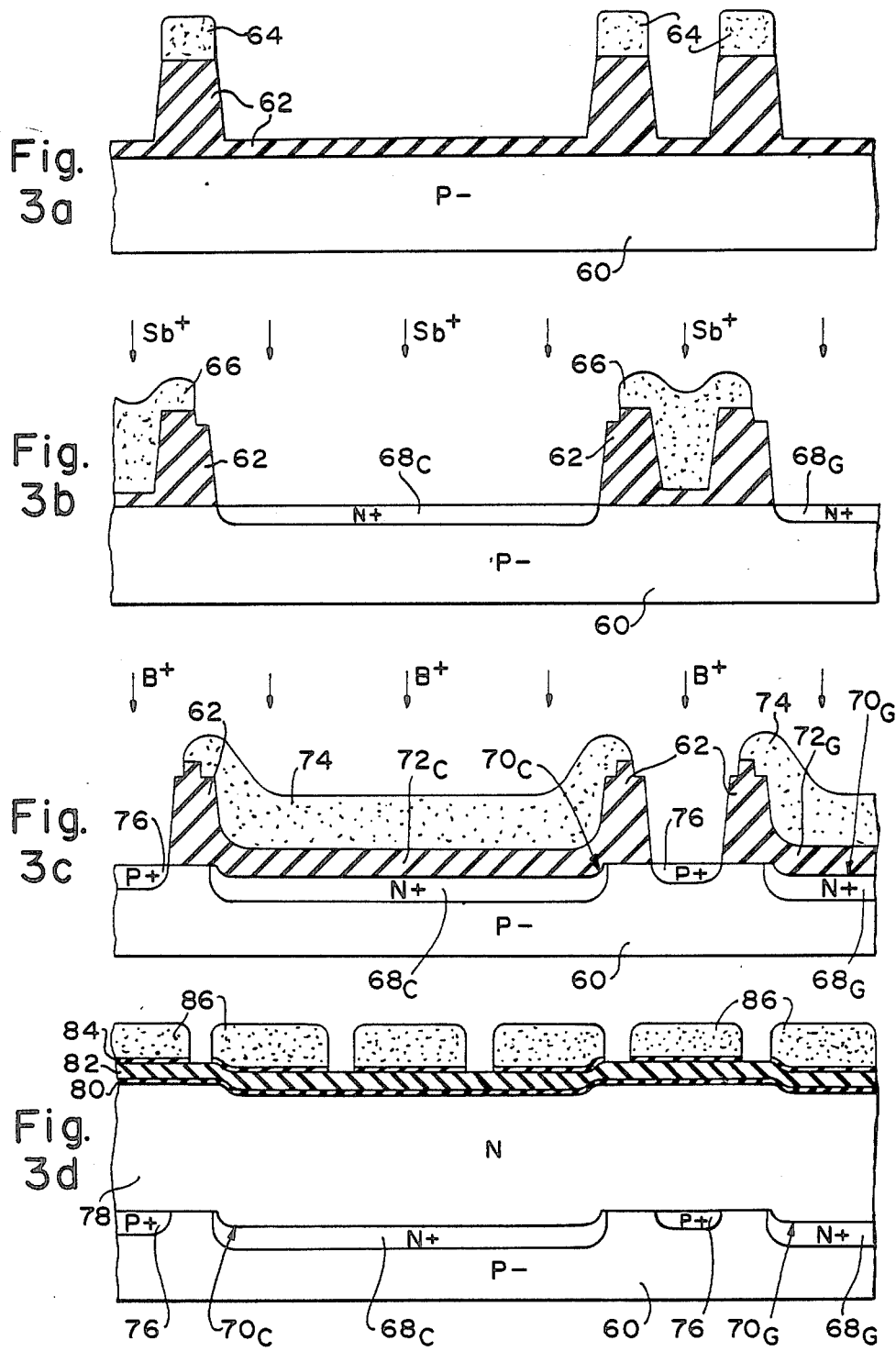

METHOD FOR MANUFACTURING PROGRAMMABLE READ-ONLY MEMORY CONTAINING CELLS FORMED WITH OPPOSING DIODES

This is a continuation of U.S. patent application, Ser. No. 367,492, filed Apr. 12, 1982, now abandoned.

FIELD OF USE

This invention relates generally to a semiconductor programmable read-only memory (PROM) and more particularly to a cellular PROM in which each PROM cell contains a pair of opposing diodes, one of which can be selectively destroyed to program the memory.

BACKGROUND ART

PROM's are becoming increasingly important in field-programmable electronic memory applications. Of particular importance is the type of PROM containing an array of rows and columns of memory cells that each consist of a pair of back-to-back PN junction diodes. A first of the diodes in each cell serves as an array element for electrically isolating the cell while the second diode is selectively destructible for programming a logical "0" or a logical "1" into the cell. The programmable diode is typically destroyed by forcing a sufficiently high reverse current to flow through its PN junction so as to permanently short circuit this junction.

Electrically insulating material such as silicon dioxide is employed in laterally separating the memory cells in some prior art PROM's using the back-to-back diode configuration. In U.K. patent publication No. 2005079A "Programmable read-only memory cell", corresponding to U.S. Pat. No. 4,229,757, M. Moussie discloses such a PROM in which each array diode is a vertical diode with its PN junction lying horizontally in a monocrystalline silicon region of a semiconductor body and fully laterally adjoining a deep (or recessed) region of silicon dioxide in the body. Each programmable diode is a horizontal diode with its PN junction located in a region of polycrystalline silicon adjoining the monocrystalline region along its upper surface. The PN junction of each programmable diode extends generally perpendicular to the lower surface of the body. This PROM is fabricated by forming an N-type epitaxial layer on the upper surface of a P-type substrate and then forming a P-type epitaxial layer on the N-type epitaxial layer. A deep N-type region contacts the bottom surface of the deep oxide region which is formed around portions of the epitaxial layers to create the array diodes. At each cell there is an aperture through an insulating layer covering the P-type epitaxial layer. The PN junctions for the programmable diodes are formed in a layer of polycrystalline silicon deposited on the insulating layer and on the portions of the P-type epitaxial layer exposed by the apertures.

Even though comparatively small currents of about 20 ma are needed to program this PROM, its horizontal diodes increase cell area. In addition, the properties of PN junctions in polycrystalline silicon are less controllable during manufacture than those in monocrystalline silicon.

T. Fukushima et al disclose another such PROM in European Patent Publication No. 0018173, "A programmable read-only memory device". In each memory cell of this PROM, the PN junctions of both diodes are located in a monocrystalline silicon region. An isolation region which contains silicon dioxide directly adjoining the monocrystalline region laterally separates the cells. Each PN junction is substantially horizontal in the middle of its cell and extends up to the upper surface of the monocrystalline region at a location spaced apart from the side walls of the isolation region. The PN junction of each array diode laterally and upwardly encloses the PN junction of the corresponding programmable diode. This PROM is manufactured by selectively forming N-type tubs along the upper surface of a P-type silicon substrate after which an N-type epitaxial layer is formed on the upper substrate surface. The lateral isolation areas are then formed, and the pairs of PN junctions are created by forming P-type regions in the epitaxial layer over the tubs and forming N-type regions in the P-type regions.

Although this PROM permits the use of shallow regions to define the diodes, the nesting of the diodes in each cell make the cell area comparatively large due to photolithographic alignment tolerances. The memory element occupies about 9 micron$^2$. This increases the programming current. Furthermore, parasitic transistor action during the programming of a cell in one tub may cause the PN junction between the substrate and another tub along the same column to forward bias so as to damage the programmable diode in the cell along the same column in the other tub.

DISCLOSURE OF THE INVENTION

A PROM formed in a semiconductor body having a recessed electrically insulating region, which preferably consists of a semiconductor oxide, and an adjoining monocrystalline semiconducting region contains a group of PROM cells laterally separated from one another along an upper surface of the semiconducting region. Each cell has a substantially horizontal first PN junction lying in the semiconducting region and a corresponding second PN junction that together form a pair of PN junction diodes in an opposing configuration. Each second PN junction is substantially horizontal and overlies the corresponding first PN junction in such a manner that the intermediate cell region between each pair of PN junctions fully adjoins the insulating region. Preferably, each second PN junction lies in the semiconducting region.

"Substantially horizontal" as applied to the cell PN junctions means that each of them largely lies in a plane parallel to a substantially flat bottom surface of the semiconductor body. Each junction is "substantially horizontal" even if it turns slightly upward (or downward) where it adjoins the insulating region. In this manner, both diodes in each PROM cell are vertical diodes. The lower diode defined by the first PN junction is normally the array element while the upper diode defined by the second PN junction is normally the programmable element. By having the PN junctions in each cell fully adjoin the insulating region, the present PROM takes up very little space. The memory element in each cell typically occupies approximately 2.25 micron$^2$ which is significantly less than in comparable prior art devices.

The maximum dopant concentration in each intermediate region desirably occurs partway between its pair of PN junctions and optimally near the mid-point between the pair of junctions. This dopant profile, which is achieved by ion implantation, facilitates PROM manufacture and improves programming operation.

The lower cell regions directly below the first PN junctions are of a first conductivity type while the intermediate cell regions are of an opposite second conductivity type. Normally, the cells are formed above a substrate region of the second conductivity type. This creates a potential problem in that the substrate region acts as the collector for a parasitic transistor in which the lower region of each cell serves as the base, and the adjoining intermediate cell region is the emitter. When the second PN junction of that cell is destroyed, its first PN junction becomes forward biased which causes the associated parasitic transistor to turn on. The current injected by the parasitic transistor into the substrate region could build up the voltage there sufficiently to cause the PN junctions between the substrate and the lower cell regions of other cells along the same column to become forward biased. In turn, this can degrade the second PN junctions of these other cells.

A composite buried layer is suitably employed to alleviate this problem and also to provide intermediate electrical connections to the lower cell regions. This buried layer includes a plurality of highly doped buried regions of the first conductivity type directly below the lower cell regions. Each buried region adjoins the insulating region along the entire lower edge of the lateral periphery of each of one or more associated lower cell regions. By having the buried regions meet the insulating region, the amplification of each parasitic transistor is substantially reduced, typically by a factor of 100. As a result, the voltage achieved in the substrate region during programming of one cell is substantially reduced so as to protect the programmable diodes in other cells along the same column.

The composite buried layer also includes a highly doped buried web of the second conductivity type laterally surrounding each buried region. The buried web provides a low resistance path for removing charge carriers injected into the substrate region by the parasitic transistors during programming so as to further prevent the substrate potential from building up.

The buried web is laterally separated from the buried regions by a lowly doped region which includes the substrate region and extends up to the insulating region. The lowly doped region serves to increase the breakdown voltage of the substrate PN junctions to an acceptable value.

An important advantage of the present memory is that it is highly insensitive to many material and process-induced defects. Only the actual memory element area of each cell is significantly subject to such defects, and this area is quite small. Connections extending through the insulation region to the composite buried layer are largely insensitive to many of these defects, while many of the PN junctions are partially or wholly protected by the insulating region. Accordingly, this PROM is particularly suitable for the manufacture of very large memory arrays.

In fabricating the PROM, the insulating region is first formed in such a manner as to fully adjoin the entire lateral boundary of each of a group of monocrystalline portions of a doped region of the first conductivity type spaced apart from one another along the top surface of the doped region. A dopant of the second conductivity type is introduced through the top surface into the monocrystalline portions to define the first PN junctions. The second PN junctions can be defined by similarly introducing a dopant of the first conductivity type through the top surface into each monocrystalline portion. The insulation region is preferably employed as a mask to control the lateral extent of these dopants in each monocrystalline portion. Preferably, the dopant of the second conductivity type is ion implanted, and the PROM is then annealed at a temperature sufficiently low to repair any lattice damage caused by the introduction of the dopants without causing any major redistribution of the dopants or other impurities introduced earlier into the PROM.

The composite buried layer and the insulating region are normally formed at an earlier point in the manufacture of the PROM. An impurity of the first conductivity type is selectively introduced into a monocrystalline semiconductor substrate of the second conductivity type at a plurality of first locations spaced apart from one another along a surface of the substrate to lay out the buried regions. Preferably, the buried web is likewise laid out by selectively introducing an impurity of the second conductivity type into the substrate at a second location laterally surrounding and spaced apart from each of the first locations. An epitaxial semiconductor layer is then grown on the surface of the substrate. A web-like portion of the epitaxial layer is removed along its upper surface to create a groove. The substrate and the remainder of the epitaxial layer are then selectively subjected to a high-temperature oxidizing environment to oxidize part of the epitaxial layer along the groove so as to form the insulation region and to cause parts of the impurities introduced into the substrate to diffuse upward into the epitaxial layer to form the composite buried layer.

BRIEF DESCRIPTION OF THE DRAWINGS

FIGS. 3a-3n are cross-sectional side views illustrating steps in the manufacturing procedure leading to the embodiment of FIGS. 1, 2a, and 2b. The cross-section of each of FIGS. 3a-3n corresponds to the cross-section of FIG. 2a.

Like reference symbols are employed in the drawings and in the description of the preferred embodiments to represent the same or very similar item or items. For convenience in illustration, the dimensions in the drawings are generally not drawn to scale.

DESCRIPTION OF THE PREFERRED EMBODIMENT

Figure 1:
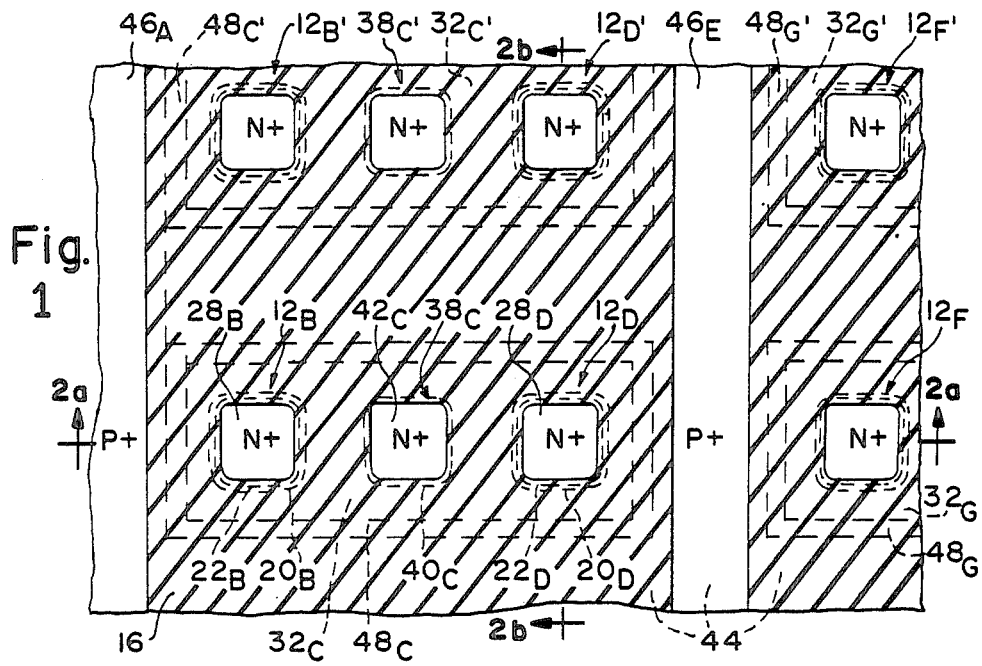
FIG. 1 is a cross-sectional layout view of an embodiment of a PROM in accordance with the invention taken through the plane 1—1 in FIGS. 2a and 2b.
Figure 2A:
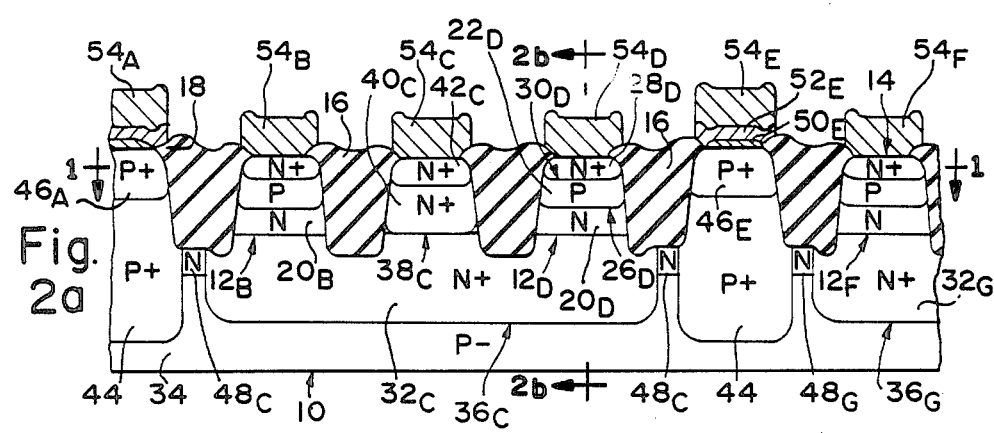
FIGS. 2a and 2b are cross-sectional side views of the embodiments of FIG. 1 taken through the planes 2a—2a and 2b—2b, respectively, in FIG. 1.
Figure 2B:
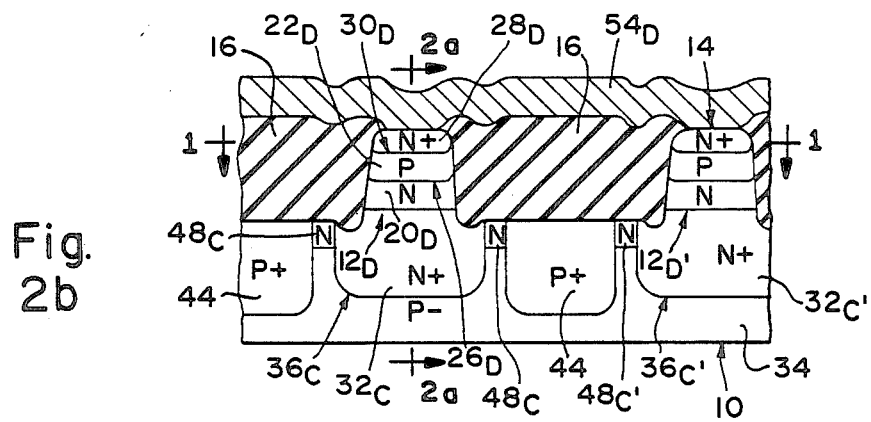

Referring to the drawings, FIG. 1 illustrates a cross-sectional layout view of a preferred embodiment of a PROM containing a group of identical PROM cells each consisting of a pair of back-to-back oxide-walled vertical diodes. FIGS. 2a and 2b are mutually perpendicular cross-sectional side views of the embodiment of FIG. 1 showing the structure of the PROM in a semiconductor body having a flat bottom surface 10. As shown in FIGS. 2a and 2b, the cross-section of FIG. 1 is taken through the plane 1—1 parallel to bottom surface 10. The elements shown in dotted lines in FIG. 1 lie below plane 1—1. The terms "lower", "bottom", "upper", "top", "below", "above", "vertical", "horizontal", and "lateral" are defined for convenience with respect to the orientation of the semiconductor body when surface 10 is parallel to the ground.

The PROM cells are arranged in an array of rows and columns. The rows are about 20 microns apart.

Six PROM cells $12_B$, $12_D$, $12_F$, $12_{B'}$, $12_{D'}$, and $12_{F'}$ are shown in FIG. 1. Cells $12_B$, $12_D$, and $12_F$ lie in one row while cells $12_{B'}$, $12_{D'}$, and $12_{F'}$ lie directly across in an adjacent row. In this manner, each subscript "B", "D", or "F" identifies a particular column, the unprimed notation denotes the row shown in FIG. 2a, and the primed notation indicates the adjacent row. Some of the inter-column regions as well as the regions centering on the inter-column regions are identified by reference symbols containing the corresponding alternating subscripts "A", "C", "E", and "G". In referring to an arbitrary one of cells $12_B$, $12_D$, $12_F$, $12_{B'}$, $12_{D'}$, and $12_{F'}$, their components, or separate column elements differentiated by the subscripts "B", "D", or "F" or to an arbitrary one of the regions whose reference symbols contain the subscripts "A", "C", "E", and "G", the subscripts "A" through "G" as well as the primed notation will generally be dropped in the present description even though they are shown as part of the complete reference symbols in the drawings. In addition, the components of some of cells 12 are not labelled or are only partially labelled in the drawings so as to avoid excessive labelling. For example, only the components of cell $12_D$ are completely labelled in FIGS. 2a and 2b.

Cells 12 are formed in a doped monocrystalline silicon region of the body along an upper surface 14 of the monocrystalline region and are laterally separated from one another by adjoining portions of a recessed web-like electrically insulating region 16 of silicon dioxide which is selectively sunk in the body along surface 14. The monocrystalline region in FIGS. 2a and 2b is that portion lying between surfaces 10 and 14 excluding insulation region 16. The center-to-center spacing of parts of oxide isolation region 16 on opposite sides of any cell 12 along a row is about 11 microns. Oxide region 16 has bird beaks 18 which encroach into the monocrystalline region causing each cell 12 to neck down along surface 14 to a cross-sectional area of about 2.25 micron$^2$. Measured from upper surface 14, the lowest surface of oxide region 16 is about 1.1 microns into the body.

Each cell 12 consists of a lower array diode and an upper programmable diode. The array diode is a vertical PN-junction element formed by a lower N region 20 and an intermediate P region 22 whose common interface defines a first PN junction 26 having a lateral area of about 4 micron$^2$ and a breakdown voltage of about 16 volts. The programmable diode is a vertical PN-junction element consisting of P region 22 and an upper N+ region 28 whose common interface is a second PN junction 30 having a lateral area of about 3 micron$^2$ and a breakdown voltage of about 6 volts. The difference in junction areas is due to the greater encroachment of bird beak 18 into cell 12 along junction 30. The greater area of junction 26 acts to prevent it from being degraded when the programmable diode is being programmed.

P region 22 fully adjoins the recessed sidewalls of insulation region 16 so that PN junctions 26 and 30 likewise fully adjoin its sidewalls. Each PN junction 26 or 30 is horizontal across most of its extent but typically turns upward near where it adjoins the sidewalls of oxide region 16. Inasmuch as the center of each junction 26 or 30 is parallel to lower surface 10, and the portion of junction 26 or 30 that turns upward is quite small, junctions 26 and 30 are appropriately characterized as "substantially horizontal".

As described in more detail below, the maximum concentration for the P-type dopant in P region 22 occurs between junctions 26 and 30 (rather than along junction 30). Desirably, the place at which the maximum P-type concentration exists in intermediate region 22 is at a vertical distance from the mid-point between junctions 26 and 30 that is no more than 20% of the distance between junctions 26 and 30. Optimally, the maximum P-type concentration occurs about half-way between junctions 26 and 30. To the extent that regions 20, 22, and 28 might be viewed as an NPN transistor with a permanently floating (unconnected) base, use of such a dopant distribution makes potential transistor operation very inefficient because intermediate region 22 is wider than a conventional transistor base so that the current gain is quite small (about 2). Moreover, this dopant distribution facilitates fabrication of a PROM in large arrays because there is a high P-type dopant concentration along the sidewalls of oxide region 16 so as to reduce the possibility of short circuiting by an inversion path or other defect mechanism.

Cells 12 are formed as the upper part of a structure in which electrical connections must be provided between lower N regions 20 and the row lines of the PROM. The lower part of the structure originally consists of a lowly doped P-type semiconductor substrate. In the absence of a buried layer having heavily-doped N-type and P-type regions, each P region 22 acts as the emitter for a vertical parasitic PNP transistor whose base is the adjoining N region 20 and whose collector is the remaining lowly doped P-type portion of the substrate.

During cell programming, the potential of all N+ regions 28 along a particular column is raised by raising the potential of the column line connected to those N+ regions 28. When any particular cell 12 such as cell $12_D$ is being programmed, its PN junction $30_D$ is avalanched, forcing current into its P region $22_D$ and through its PN junction $26_D$ which is forward biased. This can turn on the parasitic PNP transistor associated with that cell $12_D$. The base-collector junction for this vertical parasitic transistor is the base-emitter junction for a lateral parasitic NPN transistor whose base-collector junction is formed by the remaining lowly doped P-type substrate portion and N region 20 of any other cell 12 such as cell $12_{D'}$ along the same column.

When the parasitic PNP transistor saturates, its base-collector junction forward biases to raise the substrate voltage to turn on the lateral NPN transistor. This brings the voltage of N region $20_{D'}$ down to nearly that of N region $20_D$ and can degrade PN junction $30_{D'}$ since N+ region $28_{D'}$ is at the same potential as N+ region $28_D$. In short, the action of the parasitic PNP transistor associated with each cell 12 being programmed can damage the programmable diodes of other cells 12 along the same column. A composite buried layer is utilized with cells 12 to alleviate this problem, to provide intermediate electrical connections to the word lines, and to provide further electrical isolation between the rows.

One part of this composite buried layer consists of a set of buried N+ regions 32 that lie directly below lower N regions 20 and contact the lower surface of oxide region 16. Most preferably, each buried region (or tub) 32 is continuous with four of lower regions 20. However, for convenience in illustration, each tub 32 in FIGS. 1, 2a, and 2b is indicated as being continuous with only two of lower regions 20. For example, buried region $32_C$ is depicted as being continuous with lower regions $20_B$ and $20_D$. As a result, each particular tub 32 adjoins insulating region 16 along the entire lower edge of the lateral periphery of each lower region 20 that is continuous with the particular tub 32.

The average net dopant concentration in buried regions 32 is about $1.6 \times 10^{18}$ atoms/cm$^3$. Lower regions 20 have a relatively uniform net dopant concentration of about $8 \times 10^{15}$ atom/cm$^3$ which is what tubs 32 drop to along oxide region 16 where they meet regions 20 about 1.0 micron below upper surface 14. Buried regions 32 extend downward from surface 14 about 4 microns into the body.

Each of tubs 32 extends into a lowly doped P-substrate region 34 whose lower boundary is surface 10 to form a corresponding isolation PN junction 36 which is normally reverse biased. P- region 34 has a relatively uniform net dopant concentration of about $1 \times 10^{15}$ atoms/cm$^3$. This is also the N-type dopant concentration that buried regions 32 fall to along isolation junctions 36.

Isolation junctions 36 are the base-collector junctions for the parasitic PNP transistors that can turn on during programming. Since each buried region 32 fully adjoins oxide region 16 around each associated cell 12, N+ tubs 32 form part of the bases of the parasitic PNP transistors. This reduces their current amplification from about 10 in the absence of tubs 32 to about 0.1. When one of cells 12 is being programmed, the reduced amplification reduces the voltage that can be built up in substrate region 34 and thereby prevents degradation of the programmable diodes of other cells 12 in the same column.

Each buried region 32 is connected with upper surface 14 by a corresponding composite N+ region 38 consisting of a lower N+ region 40 and an upper N+ region 42. The combination of N+ regions 32 and 38 provides the necessary intermediate connections between lower cell regions 20 and the row lines. The high doping in each buried region 32 serves to reduce the series resistance between its connective region 38 and its lower cell regions 20. Connective regions 38 also provide low resistance paths to surface 14 to reduce the parasitic voltage drops that occur during cell programming.

The other part of the composite buried layer is a buried P+ web 44 which laterally surrounds each of buried N+ regions 32. Buried web 44 adjoins insulation region 16 along its lower surface and extends partly up its sidewalls. The average net dopant concentration in P+ web 44 is approximately $7 \times 10^{17}$ atoms/cm$^3$. Buried web 44 has a net dopant concentration of about $1 \times 10^{17}$ atoms/cm$^3$ where it meets the lower surface of oxide region 16, while its P-type dopant concentration drops to that of substrate region 34 about 3.5 microns below surface 14.

P+ web 44 is connected with upward surface 14 by a plurality of low resistivity P+ regions 46 which extend along the columns in the PROM. Insulation region 16 and buried web 44 in combination with connective regions 46 laterally electrically isolate cells 12 of any particular tub 32 from cells 12 of all other tubs 32. Consequently, this combination laterally isolates the rows from one another. Web 44 in combination with connective regions 46 also provides a low resistance path for removing holes collected during cell programming by PNP parasitic collector region 34. This serves to further prevent the programming of one of cells 12 from damaging the programmable diodes in other cells 12 along the same column.

Each buried region 32 is laterally separated from buried web 44 by a corresponding lowly doped region that consists of P- substrate region 34 and a corresponding epitaxial N region 48 that lies between region 34 and the lower surface of oxide region 16. N regions 48 each have a relatively uniform net dopant concentration of about $8 \times 10^{15}$ atoms/cm$^3$. The lowly doped combination of P-region 34 and N regions 48 assures that substrate isolation junctions 36 have a sufficiently high breakdown voltage (typically about 30 volts).

An arrangement of conductors in contact with the various monocrystalline regions that extend to upper surface 14 completes the PROM. Lying over each P+ region 46 is a layer 50 of platinum-nickel silicide on which there is a layer 52 of titanium-tungsten. Lying over N+ regions 28 and 42 along surface 14 and over titanium-tungsten regions 52 is a pattern of leads 54 consisting of aluminum with about 1% silicon. Leads $54_B$, $54_D$, and $54_F$ are column lines. Except for lead $54_C$ and its counterparts which connect to the row lines, all other leads 54 as shown by lead $54_D$ in FIG. 2b extend along the columns.

A second crossing path of leads of conventional design is employed to form the row lines and complete the arrangement of conductors. This second crossing pattern of leads has not been shown in the drawings so as to avoid unnecessary complexity. In employing the second pattern of leads, a layer of phosphorus-doped silicon dioxide (Vapox) lies over leads 54 and the portion of oxide region 16 between leads 54. The crossing pattern of leads consists of pure aluminum that overlies the Vapox layer and is connected to lead $54_C$ and its counterparts by way of aluminum-filled vias extending through the Vapox layer.

To program the PROM, a reverse current of about 40 ma is forced through each PN junction 30 that is to be destroyed. Where, for example, junction $30_D$ is to be destroyed, a suitable reverse voltage is applied between leads $54_C$ and $54_D$ for a suitable time which is typically less than one microsecond to cause avalanche breakdown in the programmable diode and generate the specified reverse current. The programmable diode heats up until the aluminum-silicon eutectic temperature of approximately 557° C. is reached. At this point, the programmable diode permanently short circuits as aluminum from lead $54_D$ migrates through N+ region $28_D$ to make ohmic contact with P region $22_D$. This places a logical "0" or a logical "1" in cell $12_D$ depending on the convention employed while cells 12 whose programmable diodes remain intact are in the opposite logical states.

FIGS. 3a-3n illustrate steps in manufacturing the PROM of FIGS. 1, 2a, and 2b. In the manufacturing process, boron is utilized as the P-type impurity for creating the various regions of P-type conductivity. Unless otherwise indicated, boron is ion implanted in the form of B+. Phosphorus, arsenic, and antimony are used selectively as the complementary N-type dopants. Unless otherwise indicated, they are implanted in the forms of P+, As+, and Sb+, respectively. Other appropriate impurities may be used in place of these dopants. In many of the ion implantation steps, the impurity may alternatively be introduced into the wafer by diffusion.

Conventional cleaning and photoresist masking techniques are employed in creating the various insulating, P-type, and N-type regions. To simplify the discussion, references to the cleaning steps, the steps involved in making a photoresist mask, and other such well known steps in the semiconductor art are omitted from the following description. Unless otherwise indicated, each etching of silicon dioxide is performed with a buffered etchant consisting approximately of 7 parts of 40% ammonium fluoride and 1 part of 49% hydrofluoric acid.

The initial steps in the process involve defining the locations for the composite buried layer consisting of N+ regions 32 and P+ web 44. Referring to FIG. 3a, the starting material is a semiconductor wafer containing a P-monocrystalline silicon substrate 60 having a resistivity of 7–21 ohm-cm and a thickness of about 500 microns. The wafer is subjected to an oxidizing atmosphere of oxygen and hydrogen at 1,000° C. for 360 minutes to grow a layer 62 of silicon dioxide having a thickness of approximately 1.2 microns along the upper surface of substrate 60. A photoresist mask 64 having openings generally above the locations intended for regions 32 and web 44 is formed on oxide layer 62. The exposed portions of oxide layer 62 are etched for 18 minutes to leave a thickness of 800–1,400 angstroms of silicon dioxide at the open areas in mask 64.

After removing mask 64, a non-critical photoresist mask 66 having a nominal thickness of 7,000 angstroms and having openings generally above the intended locations for tubs 32 is formed on the top surface of the wafer as shown in FIG. 3b. The exposed portions of the remainder of oxide layer 62 are etched for 3 minutes to reach the silicon in substrate 60. With mask 66 in place, antimony is implanted at a dosage of $2\times10^{15}$ ions/cm$^2$ and at an energy of 50 kiloelectron volts (KEV) through the open areas in the remainder of oxide layer 62 to form N+ regions 68.

After removing mask 66, the wafer is subjected to nitrogen for 20 minutes at 1,000° C., to oxygen and hydrogen for 13 minutes at 1,000° C., and to nitrogen for 75 minutes at 1,200° C. so as to establish registration depressions 70 at the exposed areas of substrate 60 as depicted in FIG. 3c by growing layers 72 of silicon dioxide having a thickness of approximately 2,400 angstroms. The high temperature of this step also drives the antimony in regions 68 further downward (and sideward) into substrate 60. A non-critical photoresist mask 74 having a nominal thickness of 1.2 microns and a web-type opening generally above the location intended for buried web 44 is formed on the top surface of the wafer. The exposed portions of the remainder of oxide layer 62 are etched for 3.5 minutes down to the silicon in substrate 60. With mask 74 in place, boron is implanted at a dosage of $2\times10^{14}$ ions/cm$^2$ and at an energy of 180 KEV into substrate 60 to form P+ regions 76.

After removing mask 74, the wafer is etched for 20 minutes to remove oxide layer 72 and the remaining portions of oxide layer 62 as shown in FIG. 3d. An arsenic-doped epitaxial layer 78 having a resistivity of about 0.7 ohm-cm is grown according to the well-known silane process to a thickness of approximately 1.75 microns on the exposed upper silicon surface. Regions 68 and 76 are now buried in the structure.

Oxide region 16 is now created. A layer 80 of silicon dioxide having a thickness of about 300 angstroms is first grown along the upper surface of epitaxial layer 78. This is accomplished by subjecting the wafer to dry oxygen at 1,000° C. for 11 minutes. A layer 82 of silicon nitride having a thickness of about 1,200 angstroms is deposited on oxide layer 80 according to a conventional low-pressure chemical vapor deposition process. The wafer is then subjected to oxygen and hydrogen at 1,000° C. for 120 minutes to form a thin layer 84 of silicon dioxide along the upper surface of nitride layer 82. As indicated in FIG. 3d, each registration depression 70 is reflected in layers 78, 80, 82, and 84. A photoresist mask 86 having a web-type opening corresponding to the intended location for insulation region 16 is formed on oxide layer 84. The exposed portion of oxide layer 84 is removed by etching for 1.5 minutes.

Figure 3E:
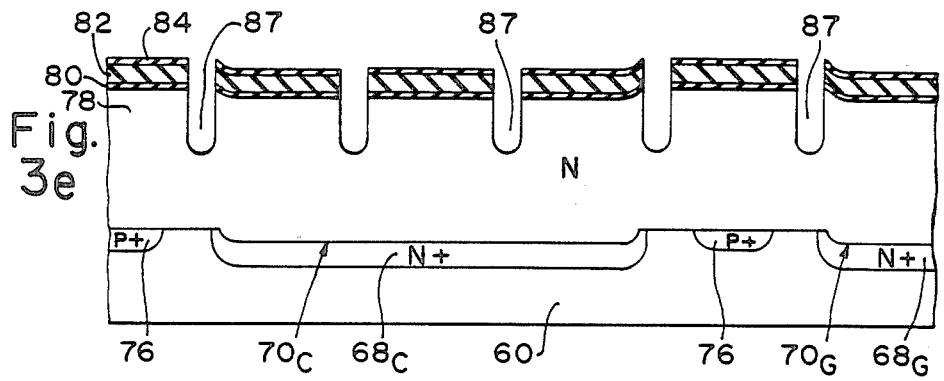

After removing mask 86, the exposed part of nitride layer 82 is removed down to oxide layer 80 as shown in FIG. 3e by etching with hot phosphoric acid at 165° C. for 50 minutes. The exposed part of oxide layer 80 is then removed down to epitaxial layer 78 by etching for 1 minute. The exposed part of epitaxial layer 78 is etched downward approximately 6,500 angstroms to form a groove 87. This is done for 5 minutes at 23° C. using an etchant consisting of 250 parts of 70% nitric acid, 40 parts of 49% hydrofluoric acid, and 1,000 parts of acetic acid saturated with iodine.

Figure 3F:
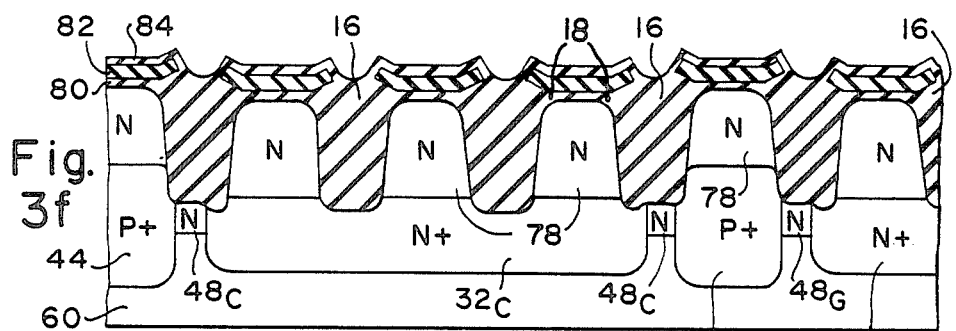

Insulation region 16 having a depth of about 1.25 microns is now formed along groove 87 as shown in FIG. 3f by subjecting the wafer to oxygen and hydrogen at 1,000° C. for 360 minutes. Oxide region 16 does not extend into substrate 60 so that portions 48 of N epitaxial layer 78 lie directly below the lower surface of oxide region 16. During this high-temperature step, the boron in region 76 diffuses both downward into substrate 60 and upward into epitaxial layer 78 so as to define P+ web 44 which extends up the sidewalls of region 16. Likewise, the antimony in regions 68 diffuses downward somewhat into substrate 60 and upward somewhat into epitaxial layer 78 to define N+ buried regions 32. More particularly, the sections of the lower surface of oxide region 16 above tubs 32 are about 1,000 angstroms lower than the remainder of the lower surface of region 16 because of registration depressions 70. Buried regions 32 extend upward at least far enough to contact the lowest surface sections of region 16.

The remaining N-type portions of epitaxial layer 78 laterally adjoining oxide region 16 are used for cells 12 and connective regions 38 and 46. Each of these N-type monocrystalline portions intended for cells 12 has lateral dimensions of about 2 microns by 2 microns below bird beaks 18.

Figure 3G:
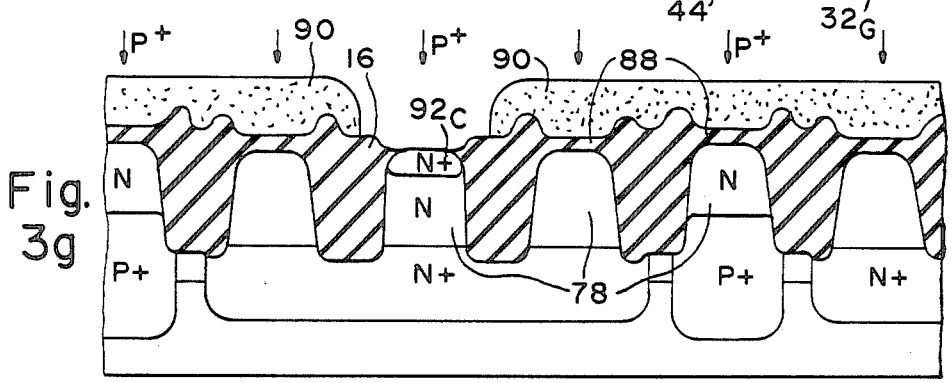

The remaining portions of oxide layer 84 (which grew slightly during the preceding high-temperature step) are removed as indicated in FIG. 3g by etching for 1.5 minutes. The remaining portions of nitride layer 82 are likewise removed by etching with hot phosphoric acid at 165° C. for 35 minutes. The remaining portions of oxide layer 80 are also removed by etching for 1 minute. An electrically insulating layer 88 of silicon dioxide having a thickness of approximately 1,000 angstroms is grown along the exposed portions of epitaxial layer 78 by subjecting the wafer to oxygen and hydrogen at 900° C. for 26 minutes. Because this oxidation is at a relatively low temperature, no significant redistribution of the impurities in tubs 32 and web 44 occurs. The formation of buried regions 32 and buried web 44 is largely complete.

Connective regions 38 and 46 as well as transistors in the peripheral circuitry are now laid out. A non-critical photoresist mask 90 having a nominal thickness of about 8,000 angstroms and open spaces above the intended locations for connective regions 38 is formed on the top of the wafer. The exposed portions of oxide layer 88 are removed by etching for 2 minutes. With mask 90 in place, phosphorus is implanted at a dosage of $3 \times 10^{15}$ ions/cm$^2$ and at an energy of 180 KEV into the exposed portions of epitaxial layer 78 to form N+ regions 92.

Figure 3H:
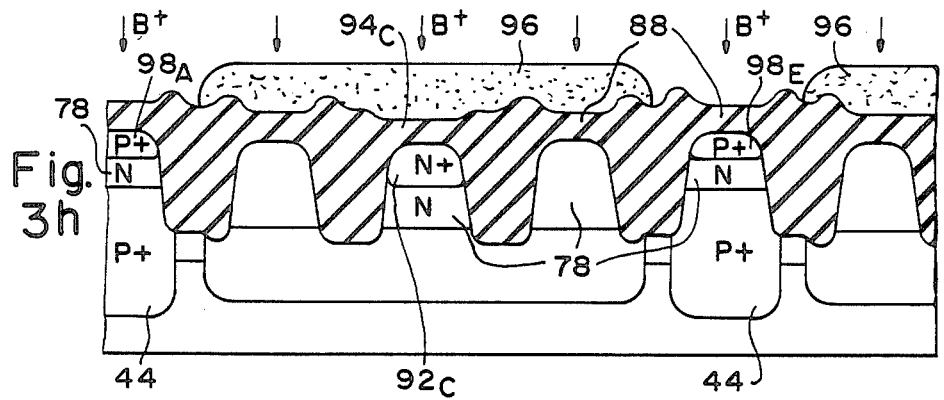

After removing mask 90, the wafer is annealed in nitrogen for 120 minutes at 1,000° C. to repair lattice damage. The wafer is then subjected to oxygen and hydrogen at 900° C. for 31 minutes to grow layers 94 of silicon dioxide having a thickness of about 1,400 angstroms at the exposed portions of epitaxial layer 78 as shown in FIG. 3h. During this oxidation step, oxide layers 88 increase about 1,000 angstroms in thickness. The phosphorus in regions 92 redistributes to expand them downward, and the boron in web 44 diffuses slightly upward. No significant redistribution of the antimony in tubs 32 occurs during these treatments.

A photoresist mask 96 having a nominal thickness of 1.2 microns and open spaces over the intended locations for P+ connective regions 46 is formed on the top of the wafer. Mask 96 is non-critical with respect to regions 46. With mask 96 in place, boron is doubly implanted through the exposed portions of oxide layer 88 into the underlying portions of epitaxial layer 78 to form P+ regions 98. The first implant is at a dosage of $1 \times 10^{13}$ ions/cm$^2$ and at an energy of 180 KEV while the second implant is at a dosage of $1.5 \times 10^{14}$ ions/cm$^2$ and at an energy of 75 KEV. The double boron implant also establishes a desired impurity distribution for bases of NPN transistors and for the emitters and collectors of PNP transistors in the peripheral circuitry.

Figure 3I:
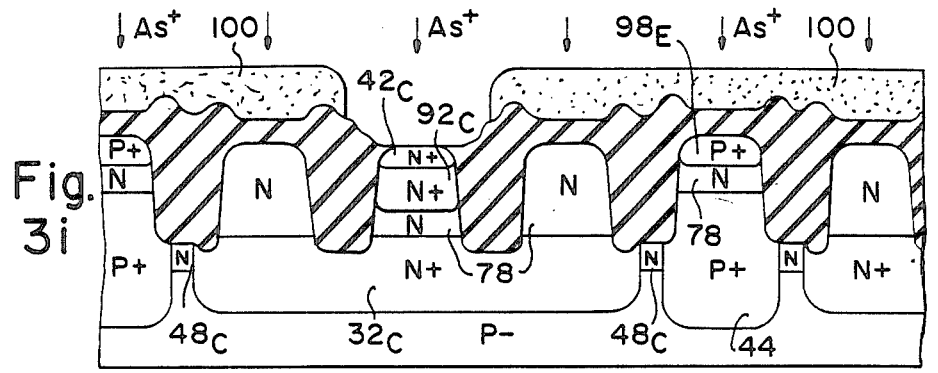

After removing mask 96, a photoresist mask 100 having a nominal thickness of 8,000 angstroms and openings above the intended locations for connective regions 38 is formed on the top of the wafer as shown in FIG. 3i. Mask 100 is non-critical with regard to regions 38. Oxide layers 94 are removed by etching for 4 minutes. N+ regions 42 are formed in upper portions of regions 92 by first deeply implanting arsenic at a dosage of $1 \times 10^{15}$ ions/cm$^2$ and at an energy of 180 KEV, removing mask 100, and then shallowly implanting arsenic at a dosage of $2 \times 10^{15}$ ions/cm$^2$ and at an energy of 50 KEV. The double arsenic implant also establishes a desired impurity distribution for the emitters of NPN transistors in the peripheral circuitry.

Figure 3J:
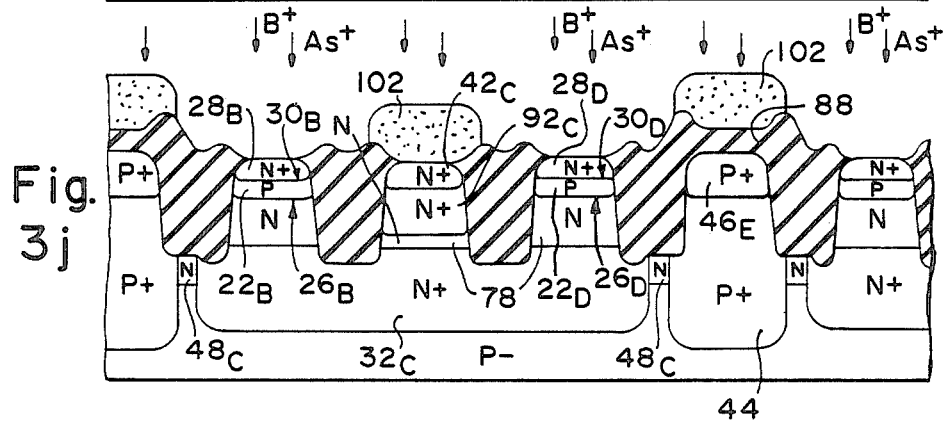

The wafer is annealed in nitrogen at 1,000° C. for 60 minutes to repair implant lattice damage and to cause the arsenic and boron in regions 42 and 98 to redistribute. As shown in FIG. 3j, regions 42 move downward. The boron in buried web 44 expands slightly outward, and regions 98 move downward to meet web 44 and become P+ connective regions 46. Regions 32 and 92 also grow slightly.

Next, the diodes in cells 12 are formed. A non-critical photoresist mask 102 having a nominal thickness of 1.2 microns and openings above the intended locations for cells 12 is formed on the top of the wafer. The exposed portions of oxide layers 88 are removed down to epitaxial layer 78 by etching for 5 minutes. With mask 102 in place, boron is implanted into epitaxial layer 78 at a dosage of $3.5 \times 10^{13}$ ions/cm$^2$ and at an energy of 110 KEV to define PN junctions 26. Arsenic is then similarly implanted into epitaxial layer 78 at a dosage of $6 \times 10^{14}$ ions/cm$^2$ and at an energy of 50 KEV to define PN junctions 30. In each of these implants, the sidewalls of insulation region 16 serve as a mask to control the lateral extents of the boron and arsenic impurities and thereby the lateral extents of junctions 26 and 30. These two implants establish P regions 22 and N+ regions 28.

Figure 3K:
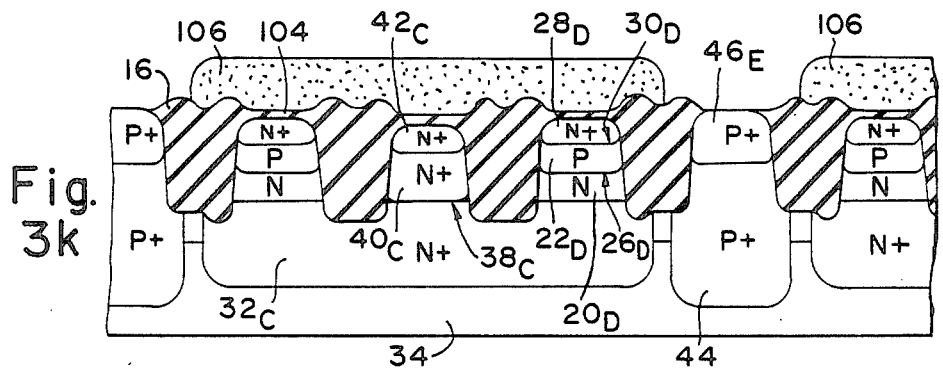

After removing mask 102, the wafer is annealed at 950° C. in nitrogen for 5 minutes, in oxygen for 25 minutes, and then in nitrogen again for 5 minutes to repair the lattice damage caused by the implantations to form regions 22 and 28. This anneal causes regions 22 and 28 to expand slightly downward to their final positions as shown in FIG. 3k, thereby leaving regions 20 as the remaining portions of N epitaxial layer 78 within cells 12. Regions 42 and 92 also expand slightly downward to their final positions where regions 92 become N+ regions 40 that meet the associated buried regions 28. Regions 46 likewise move downward slightly to their final positions. During the annealing step, layers 104 of silicon dioxide having a thickness of approximately 400 angstroms grow at the exposed silicon of regions 28 and 42 along the top of the wafer. This annealing step completes the manufacture of the diodes in PROM cells 12 as well as connective regions 38 and 46.

Figure 4:
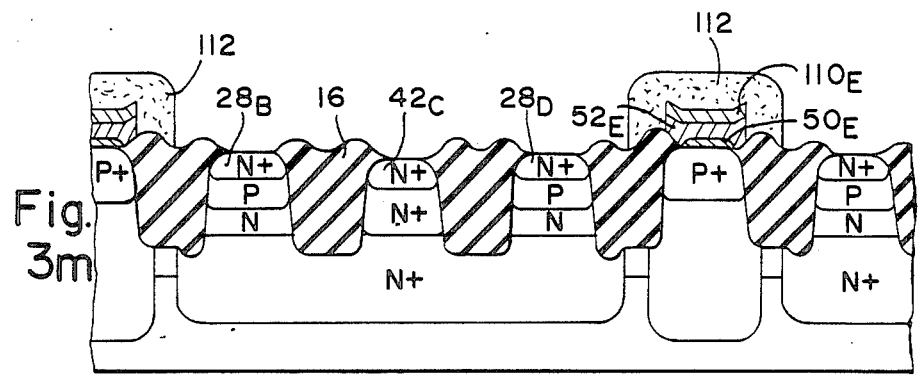
FIG. 4 is a graph of the dopant concentration of a typical PROM cell in accordance with the invention.
Figure 4:
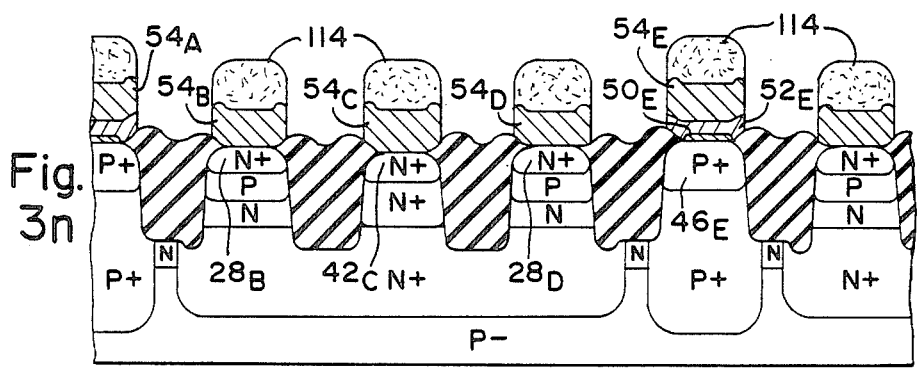
Figure 4:
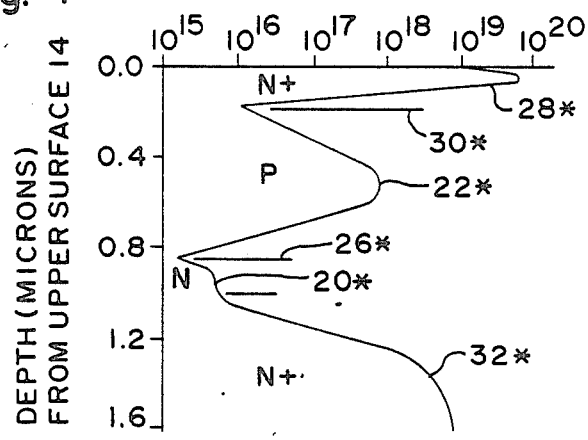

Referring to FIG. 4, it shows the final dopant concentration as a function of depth from upper surface 14 (which underlies oxide layer 104) at the middle of any cell 12 down into its tub 32. FIG. 4 is taken, for example, through plane 2b—2b in FIG. 2a or the equivalent plane in FIG. 3k. The starred reference symbols in FIG. 4 refer to the dopant concentrations and junction locations of the PROM elements identified with non-starred symbols. As indicated in FIG. 4, the maximum boron concentration in each P region 22 occurs approximately half-way between its PN junctions 26 and 30 at their final positions.

The wafer is now ready for fabrication of the conductive leads which will contact regions 28, 42, and 46 along the top of the wafer. A non-critical photoresist mask 106 having openings above P+ regions 46 is formed along the top of the wafer. Oxide regions 88 are removed down to regions 46 by etching for 4 minutes.

Figure 3L:
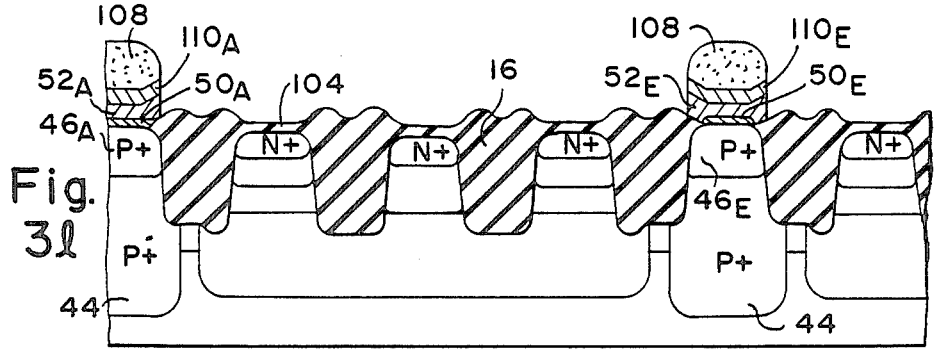

After removing mask 106, about 250 angstroms of platinum with 60% nickel are deposited on the top surface of the wafer according to conventional sputtering techniques. The wafer is then sintered at 475° C. to convert the platinum/nickel deposited on the bare silicon of connective regions 46 into layers 50 of platinum-nickel silicide as depicted in FIG. 3l. The platinum/nickel not converted to silicide is removed by etching with aqua regia. A layer of titanium-tungsten having a thickness of about 1,000 angstroms is deposited over the resulting top of the wafer. A layer of aluminum is then deposited to a thickness of about 1,000 angstroms over the top of the wafer including on the titanium-tungsten. A photoresist mask 108 whose polymerized photoresist generally overlies regions 46 is formed on the top of the wafer. The exposed aluminum is removed by etching with a conventional aluminum etchant to leave aluminum regions 110, and the resultant exposed titanium-tungsten is etched with hydrogen peroxide to leave titanium-tungsten layers 52.

After removing mask 108, a non-critical photoresist mask 112 having polymerized photoresist overlying the composite sandwiches of regions 50, 52, and 110 is formed on the top surface of the wafer as shown in FIG. 3m. Oxide layers 104 are removed by etching for 1.7 minutes with a buffered etchant consisting of 20 parts of 40% ammonium fluoride to 1 part of 49% hydrofluoric acid to expose N+ regions 28 and 42.

After removing mask 112, aluminum layers 110 are removed by etching. A layer of aluminum with 1% silicon is now deposited on the top of the wafer to a thickness of 7,000 angstroms. The aluminum layer is patterned to create leads 54 by forming a photoresist mask 114 over the aluminum layer with polymerized photoresist overlying regions 28 and 42 and then removing the exposed aluminum by etching with a standard aluminum etchant as illustrated in FIG. 3n. Mask 114 is then removed to yield the structure shown in FIG. 2a (and in FIG. 2b).

As pointed out above, a second layer of aluminum leads is provided in a conventional manner. This is accomplished by depositing a layer of Vapox on the top of the wafer to a thickness of approximately 9,000 angstroms, etching vias down to selected ones of leads 54 using an appropriate photoresist mask, depositing a layer of pure aluminum on the Vapox and over the selected leads 54 and then patterning this aluminum layer using another photoresist mask to complete the PROM.

While the invention has been described with reference to a particular embodiment, this description is solely for the purpose of illustration and is not to be construed as limiting the scope of the invention claimed below. For example, the connective regions for the composite buried layer could be laid out after the diodes in the PROM cells are laid out. Alternatively, the connective regions for the composite buried layers and the diodes for the PROM cells might be laid out using largely the same implantation/diffusion steps. Materials and dopants of opposite conductivity type may be used in place of those described above. Thus, various modifications, changes, and applications may be made by those skilled in the art without departing from the true scope and spirit of the invention as defined by the appended claims.

What is claimed is:

1. A method for manufacturing a programmable read-only memory (PROM) in which a semiconductor body is provided with a recessed electrically insulating region that fully adjoins the entire lateral boundary of each of at least two monocrystalline portions of a doped semiconducting region of a first conductivity type spaced laterally apart from one another along a top surface of the doped semiconducting region, a semiconductor dopant of a second conductivity type opposite to the first conductivity type is introduced through the top surface into part of each monocrystalline portion to define therein a substantially horizontal first PN junction that fully adjoins the insulating region and to leave therein a lower region of the first conductivity type, and a substantially horizontal second PN junction that fully adjoins the insulating region is defined in each monocrystalline portion above its first PN junction, characterized in that the step of introducing comprises ion implanting the dopant into the monocrystalline portions with energy sufficient to cause the maximum concentration of the dopant to occur below the second PN junctions at a vertical distance from the mid-point between the pair of first and second PN junctions in each monocrystalline portion that is no more than 20 percent of the distance between that pair of PN junctions.

2. A method as in claim 1 characterized in that the maximum concentration of the dopant in each monocrystalline portion is approximately half-way between its pair of PN junctions.

3. A method as in claim 1 wherein the step of introducing includes utilizing the insulation region as a mask to control the lateral extent of the dopant of the second conductivity type in each monocrystalline portion and wherein the step of defining each second PN junction involves the step of introducing a semiconductor dopant of the first conductivity type through the top surface into each monocrystalline portion utilizing the insulation region as a mask to control the lateral extent of the dopant of the first conductivity type in each monocrystalline portion, characterized, after the steps of introducing, by the step of annealing the PROM at a sufficiently low temperature to repair lattice damage that occured during the steps of introducing without causing any substantial redistribution of semiconductor impurities that are in the PROM but were not introduced into it during the steps of introducing.

4. A method as in claim 3 wherein a plurality of buried regions of the first conductivity type are formed laterally apart from one another in the body at an average net dopant concentration greater than that of the lower regions, each buried region being upwardly continuous with at least one of the lower regions, and adjoining the insulation region along the entire lower edge of the lateral periphery of each such lower region, characterized in that the steps of forming the buried regions and providing the insulating region together comprise:
   selectively introducing a semiconductor impurity of the first conductivity type into a monocrystalline semiconductor substrate of the second conductivity type at a like plurality of first locations spaced apart from one another along a surface of the substrate;
   growing an epitaxial semiconductor layer on the surface of the substrate;
   removing a web-like portion of the epitaxial layer along its upper surface to create a groove therein; and
   subjecting the substrate and the remainder of the epitaxial layer at high temperature selectively to an oxidizing environment to oxidize part of the epitaxial layer along the groove so as to form the insulation region and to cause part of the impurity of the first conductivity type to diffuse upward into the epitaxial layer to meet the lower surface of the insulation region and form the buried regions.

5. A method as in claim 3 wherein a plurality of buried regions of the first conductivity type are formed laterally apart from one another in the body at an average net dopant concentration greater than that of the lower regions, each buried region being upwardly continuous with at least one of the lower regions and adjoining the insulation region along the entire lower edge of the lateral periphery of each such lower region, characterized by the step of forming a highly doped buried web of the second conductivity type laterally surrounding each buried region.

6. A method as in claim 5 characterized in that the buried web is laterally spaced apart from the buried regions.

7. A method as in claim 4 characterized, prior to the step of growing the epitaxial layer, by the step of selectively introducing a semiconductor impurity of the second conductivity type into the substrate at a second location laterally surrounding and spaced apart from each of the first locations to form a buried web of the second conductivity type laterally surrounding each buried region.

8. A method as in claim 7 characterized in that part of the impurity of the second conductivity type diffuses upward into the epitaxial layer during the step of subjecting so as to form the buried web.

9. A method as in claim 8 characterized in that the semiconductor impurities introduced into the substrate at the first and second locations are sufficiently apart from one another that the buried regions are spaced apart from the buried web.

10. A method as in claim 5 characterized, separate from the step of introducing the dopant of the second conductivity type into each monocrystalline portion, by the further step of introducing semiconductor dopant of the second conductivity type into the doped semiconducting region to form at least one connective region of the second conductivity type spaced apart from the monocrystalline portions and extending from the buried web to the upper surface of the doped semiconducting region.

11. A method as in claim 10 characterized, separate from the step of introducing the dopant of the first conductivity type into each monocrystalline portion, by the further step of introducing dopant of the first conductivity type into the doped semiconducting region to form a like plurality of highly doped connective regions of the first conductivity type spaced apart from the monocrystalline portions and corresponding on a one-to-one basis to the buried regions, each connective region extending from the corresponding buried region to the upper surface of the doped semiconducting region.

12. A method as in claim 11 characterized in that the further steps of introducing are employed in forming bipolar transistors in peripheral circuitry for the PROM.

13. In a method for manufacturing a programmable read-only memory (PROM) in wich a semiconductor body contains a recessed electrically insulating region and an adjoining monocrystalline semiconducting region having an upper surface along which at least two PROM cells are laterally separated from one another, each cell having substantially horizontal first and second PN junctions located in the semiconducting region where the second PN junction overlies the first PN junction to form a pair of PN diodes connected to each other in an opposing configuration such that the intermediate region between the PN junctions fully laterally adjoins the insulating region, the step of introducing a semiconductor dopant through a top surface of the semiconducting region into a first region thereof to define the first PN junctions using the insulation region as mask to control their lateral extents, the dopant being ion implanted with energy sufficient to cause the maximum concentration of the dopant to exist at a vertical distance from the mid-point between the pair of PN junctions in each intermediate region that is no more than 20 percent of the distance between that pair of PN junctions.

14. In a method as in claim 13, the step of introducing another semiconductor dopant through the top surface into the first region to define the second PN junctions using the insulation region as a mask to control their lateral extents and, after the steps of introducing, the step of annealing the PROM at a suitable temperature so as to repair lattice damage that occurred during the steps of introducing without causing significant redistribution of semiconductor impurities that are in the PROM but were not introduced into it during the steps of introducing.

* * * * *